United States Patent
Mis et al.

(10) Patent No.: US 7,994,043 B1
(45) Date of Patent: Aug. 9, 2011

(54) LEAD FREE ALLOY BUMP STRUCTURE AND FABRICATION METHOD

(75) Inventors: J. Daniel Mis, Cary, NC (US); Glenn A. Rinne, Apex, NC (US)

(73) Assignee: Amkor Technology, Inc., Chandler, AZ (US)

( * ) Notice: Subject to any disclaimer, the term of this patent is extended or adjusted under 35 U.S.C. 154(b) by 118 days.

(21) Appl. No.: 12/108,909

(22) Filed: Apr. 24, 2008

(51) Int. Cl.
*H01L 21/44* (2006.01)

(52) U.S. Cl. .......................... 438/612; 438/613

(58) Field of Classification Search .............. 438/612, 438/613
See application file for complete search history.

(56) References Cited

U.S. PATENT DOCUMENTS

| | | | |
|---|---|---|---|
| 3,392,442 A | 7/1968 | Napier et al. | 29/628 |
| 4,035,526 A | 7/1977 | Konantz et al. | 427/90 |
| 4,756,467 A | 7/1988 | Schatzberg | 228/208 |
| 4,950,623 A | 8/1990 | Dishon | 437/183 |
| 5,268,072 A | 12/1993 | Agarwala et al. | 156/664 |
| 5,461,261 A | 10/1995 | Nishiguchi | 257/781 |
| 5,872,404 A * | 2/1999 | Lynch et al. | 257/781 |
| 6,013,572 A | 1/2000 | Hur et al. | 438/614 |
| 6,027,957 A | 2/2000 | Merritt et al. | 438/106 |
| 6,144,103 A | 11/2000 | Miller et al. | 257/781 |
| 6,162,660 A | 12/2000 | LaFontaine, Jr. et al. | 438/108 |
| 6,162,718 A | 12/2000 | Boettcher | 438/613 |
| 6,251,501 B1 | 6/2001 | Higdon et al. | 428/209 |
| 6,281,106 B1 * | 8/2001 | Higdon et al. | 438/613 |
| 6,300,234 B1 * | 10/2001 | Flynn et al. | 438/612 |
| 6,468,893 B2 | 10/2002 | Ueoka | 438/612 |
| 6,489,229 B1 | 12/2002 | Sheridan et al. | 438/614 |
| 6,492,197 B1 * | 12/2002 | Rinne | 438/108 |
| 6,555,296 B2 * | 4/2003 | Jao et al. | 430/312 |
| 6,596,621 B1 | 7/2003 | Copeland et al. | 438/614 |
| 6,617,237 B1 | 9/2003 | Lee et al. | 438/613 |
| 6,642,079 B1 | 11/2003 | Liu et al. | 438/108 |
| 6,673,711 B2 | 1/2004 | Tong et al. | 438/613 |
| 6,784,086 B2 | 8/2004 | Ray et al. | 438/612 |
| 6,969,915 B2 | 11/2005 | Tago et al. | 257/781 |
| 6,977,213 B1 | 12/2005 | Tsai et al. | 438/612 |
| 7,119,000 B2 | 10/2006 | Shimizu et al. | 438/597 |
| 7,205,221 B2 | 4/2007 | Akram et al. | 438/612 |
| 2004/0121267 A1 | 6/2004 | Jang | 430/315 |
| 2007/0102815 A1 | 5/2007 | Kaufmann et al. | 257/737 |

FOREIGN PATENT DOCUMENTS

JP 2003-342784 12/2003

* cited by examiner

*Primary Examiner* — Thanh V Pham
*Assistant Examiner* — Caleb Henry
(74) *Attorney, Agent, or Firm* — Gunnison, McKay & Hodgson, L.L.P.; Serge J. Hodgson

(57) ABSTRACT

A method includes forming a patterned resist layer comprising a resist layer opening overlying a bond pad of a substrate. The resist layer opening is at least partially filled with a first solder component layer. A second solder component layer is formed on the first solder component layer. The patterned resist layer is removed. The first solder component layer and the second solder component layer are reflowed to form a lead free binary metal alloy solder bump electrically connected to the bond pad.

11 Claims, 12 Drawing Sheets

LEAD FREE ALLOY BUMP STRUCTURE AND FABRICATION METHOD

BACKGROUND OF THE INVENTION

1. Field of the Invention

The present application relates to the field of electronics, and more particularly, to methods of forming interconnection bumps and related structures.

2. Description of the Related Art

C4 (Controlled-Collapse Chip Connection) is used to connect IC (integrated circuit) chips to substrates in electronic packages. Moreover, C4 is a flip-chip technology in which the interconnections may be provided using relatively small solder balls on the chip surface. Because it is an area array, C4 technology may provide relatively high densities for chip interconnections.

C4 technology has been used since the 1960s and has proven reliable in the semiconductor field. Historically, PbSn (lead-tin) solder has been evaporated through a metal mask.

Recently, due to environmental and other concerns, the use of lead containing solder has been discouraged, restricted or otherwise prohibited. Instead of using lead, solder bumps are formed by electroplating a metal alloy material. Unfortunately, electroplating metal alloy solder bumps is very difficult, requiring careful monitoring and control of the electroplating bath chemistry. Accordingly, the cost of electroplating metal alloy solder is relatively high and the associated yield is relatively low.

SUMMARY OF THE INVENTION

A method includes forming a patterned resist layer comprising a resist layer opening overlying a bond pad of a substrate. The resist layer opening is at least partially filled with a first solder component layer. A second solder component layer is formed on the first solder component layer. The patterned resist layer is removed. The first solder component layer and the second solder component layer are reflowed to form a lead free binary metal alloy solder bump electrically connected to the bond pad.

The binary metal alloy solder bump is created by forming the first solder component layer and the second solder component layer separately using a simple single component formation method. Accordingly, the cost of forming the binary metal alloy solder bump is low and the associated yield is high. Further, the use of lead is avoided.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 4:
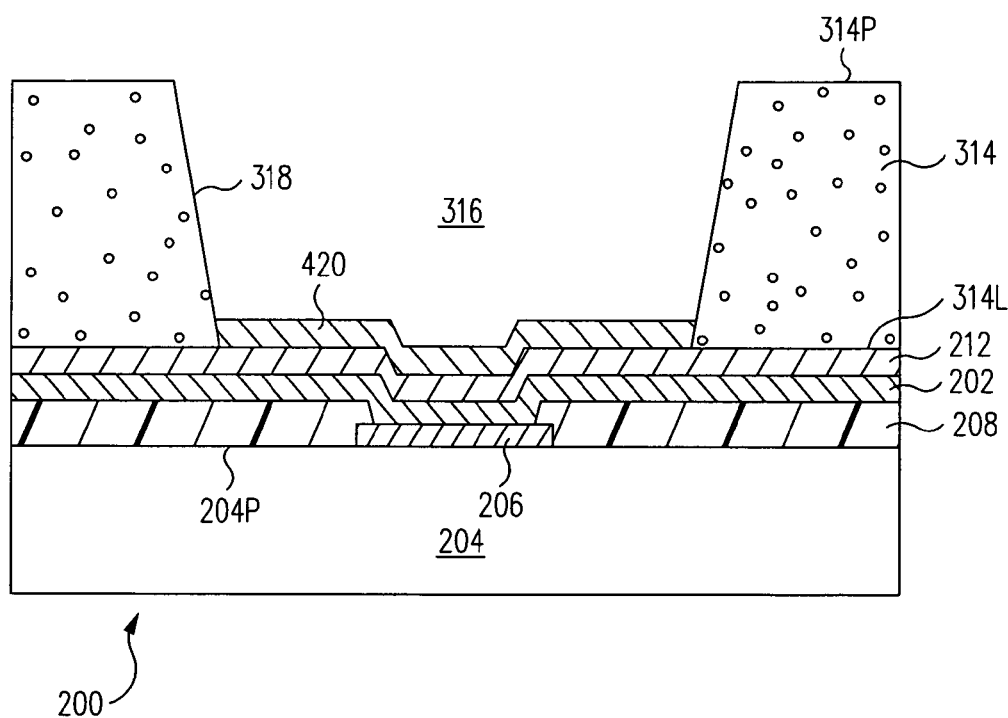

Referring to FIG. 4, a method includes forming a patterned resist layer 314 comprising a resist layer opening 316 overlying a bond pad 206 of a substrate 204.

Figure 6:
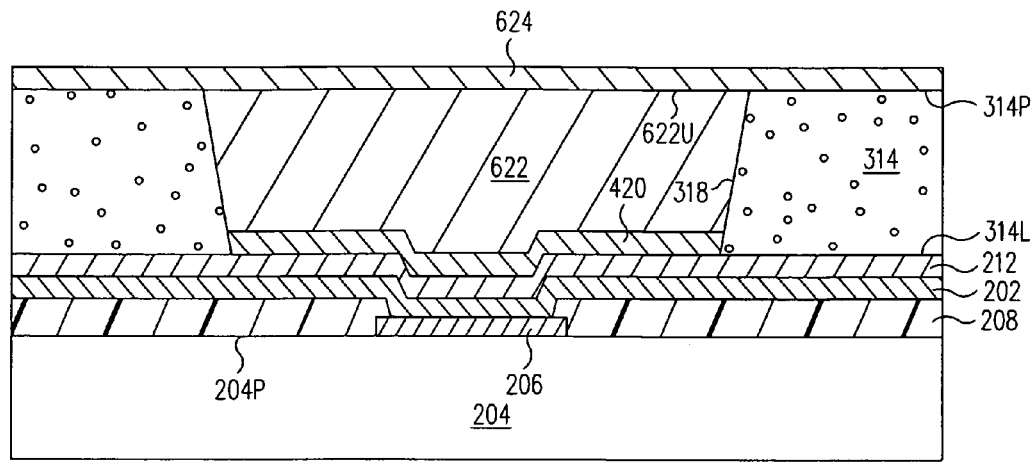
FIG. 6 is a cross-sectional view of the lead free alloy bump structure of FIG. 4 at a further stage during fabrication in accordance with one embodiment.

Referring now to FIGS. 4 and 6 together, resist layer opening 316 is at least partially filled with a first solder component layer 622. A second solder component layer 624 is formed on first solder component layer 622.

Figure 14:
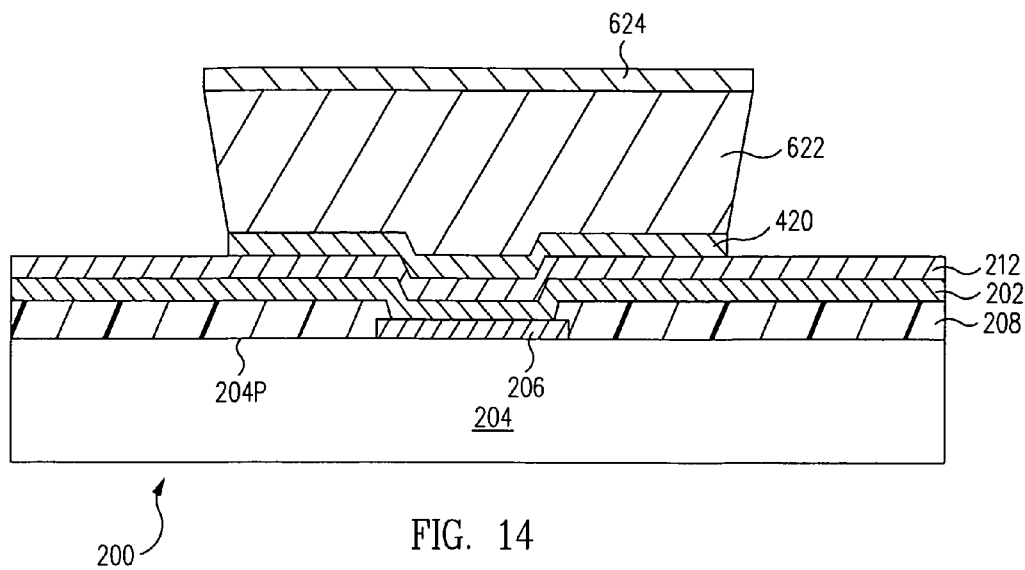
FIG. 14 is a cross-sectional view of the lead free alloy bump structure of FIG. 6 at a further stage during fabrication in accordance with one embodiment.
Figure 15:
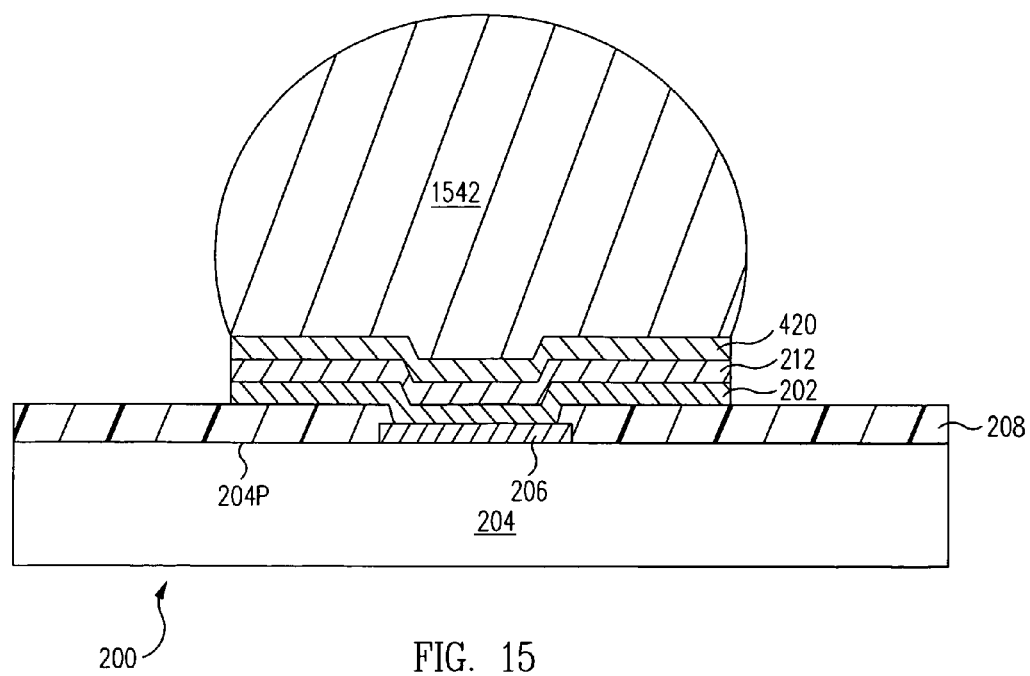
FIG. 15 is a cross-sectional view of the lead free alloy bump structure of FIG. 14 at a further stage during fabrication in accordance with one embodiment.

Referring now to FIGS. 6, 14 and 15 together, patterned resist layer 314 is removed. First solder component layer 622 and second solder component layer 624 are reflowed to form a lead free binary metal alloy solder bump 1542 (FIG. 15) electrically connected to bond pad 206.

Binary metal alloy solder bump 1542 is created by forming first solder component layer 622 and second solder component layer 624 separately using a simple single component formation method. Accordingly, the cost of forming binary metal alloy solder bump 1542 is low and the associated yield is high. Further, the use of lead is avoided.

Figure 1:
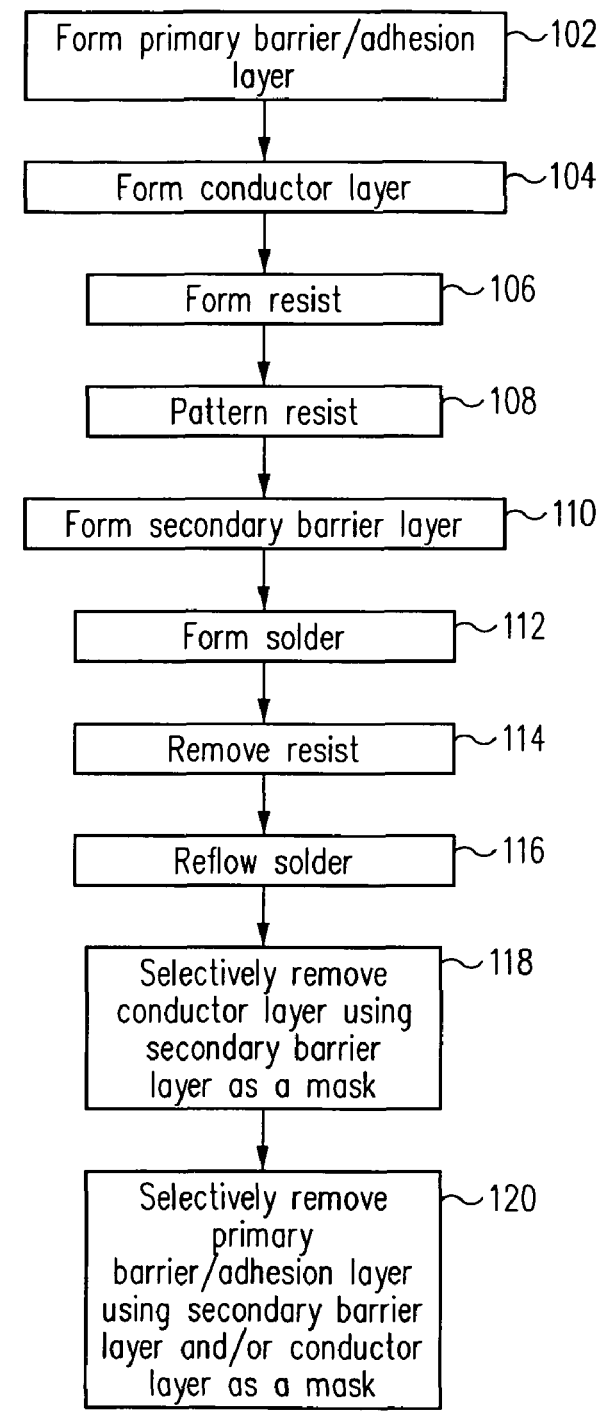
FIG. 1 is a lead free alloy bump formation method in accordance with one embodiment of the present invention.
Figure 2:
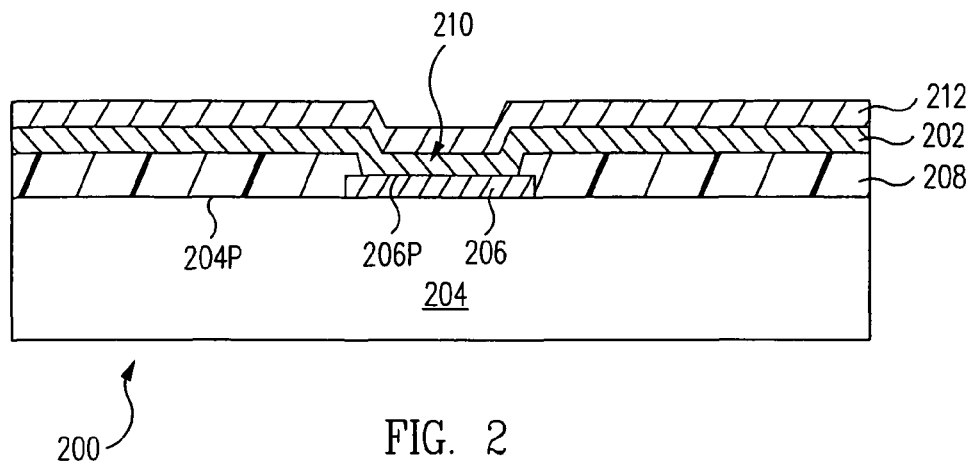
FIG. 2 is a cross-sectional view of a lead free alloy bump structure in accordance with one embodiment of the present invention.

More particularly, FIG. 1 is a lead free alloy bump formation method 100 in accordance with one embodiment of the present invention. FIG. 2 is a cross-sectional view of a lead free alloy bump structure 200 in accordance with one embodiment of the present invention.

Referring now to FIGS. 1 and 2 together, in a form primary barrier/adhesion layer operation 102, a primary barrier/adhesion layer 202 is formed on a substrate 204. In one embodiment, substrate 204 is an integrated circuit substrate, e.g., a silicon substrate, including integrated circuit devices therein. Substrate 204 includes a principal surface 204P.

Substrate 204 includes a bond pad 206, sometimes called a metal pad. In one embodiment, bond pad 206 provides electrical connection with integrated circuit devices of substrate

204. Bond pad 206 is formed of an electrically conductive material. In various embodiments, a principal surface 206P of bond pad 206 includes aluminum (Al), gold (Au), copper (Cu), and/or alloys thereof.

In one embodiment, a passivation layer 208, e.g., an electrically insulating layer, is formed on principal surface 204P of substrate 204. A passivation layer opening 210 is formed in passivation layer 208 to selectively expose a portion of bond pad 206. In accordance with this embodiment, passivation layer 208 extends over the periphery of bond pad 206 and exposes a central portion of bond pad 206. However, in other embodiments, passivation layer opening 210 exposes other portions of bond pad 206 or exposes bond pad 206 entirely. In yet another embodiment, passivation layer 208 is not formed.

As set forth above, in form primary barrier/adhesion layer operation 102, primary barrier/adhesion layer 202, sometimes called a primary barrier layer, is formed on substrate 204. More particularly, primary barrier/adhesion layer 202 is blanket formed on passivation layer 208 and on bond pad 206 exposed through passivation layer opening 210. Illustratively, primary barrier/adhesion layer 202 is formed by sputtering and/or evaporation.

In one embodiment, primary barrier/adhesion layer 202 provides a barrier protecting bond pad 206, passivation layer 208, and/or substrate 204 from additional layers formed on primary barrier/adhesion layer 202 as set forth below. In another embodiment, primary barrier/adhesion layer 202 has good adhesion to bond pad 206, passivation layer 208, and/or substrate 204 preventing delamination of additional layers formed on primary barrier/adhesion layer 202 as set forth below.

Primary barrier/adhesion layer 202 is formed of an electrically conductive material, e.g., titanium (Ti), titanium tungsten (TiW), titanium nitride (TiN), chromium (Cr), and/or combinations thereof.

From form primary barrier/adhesion layer operation 102, flow moves to a form conductor layer operation 104. In form conductor layer operation 104, a conductor layer 212 is formed on primary barrier/adhesion layer 202. More particularly, conductor layer 212 is blanket, i.e., non-selectively, formed on primary barrier/adhesion layer 202. In one embodiment, conductor layer 212 is formed by sputtering and/or evaporation.

Conductor layer 212 is an electrically conductive material having excellent electrical conductivity. Examples of conductor layer 212 include copper and titanium tungsten.

Primary barrier/adhesion layer 202 and conductor layer 212 collectively form a plating conductor layer, sometimes called a seed layer, for electroplating additional conductive layers as discussed further below.

In one embodiment, form primary barrier/adhesion layer operation 102 and/or form conductor layer operation 104 are not performed and thus are optional operations. For example, metal alloy solder bumps in accordance with various embodiments as disclosed herein are formed on copper pillars, and so operations 102, 104 are not performed.

Figure 3:
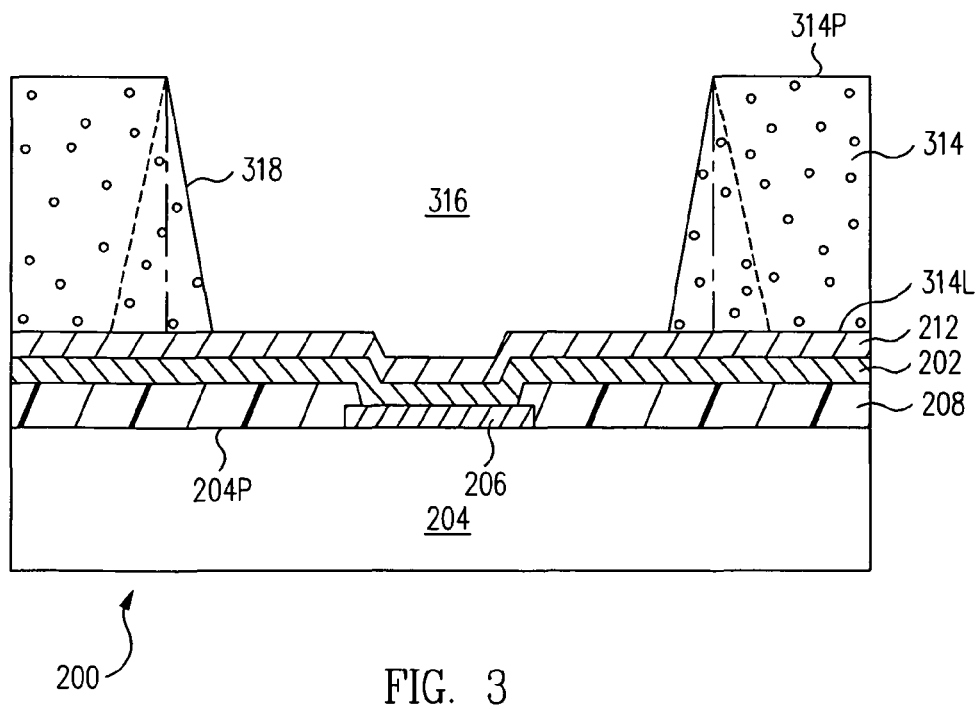
FIGS. 3 and 4 are cross-sectional views of the lead free alloy bump structure of FIG. 2 at further stages during fabrication in accordance with various embodiments of the present invention.

FIG. 3 is a cross-sectional view of lead free alloy bump structure 200 of FIG. 2 at a further stage during fabrication in accordance with one embodiment of the present invention. Referring now to FIGS. 1 and 3 together, from form conductor layer operation 104, flow moves to a form resist operation 106. In form resist operation 106, a resist, e.g., photoresist, is formed on conductor layer 212 and more generally on substrate 204. More particularly, the resist is blanket formed on conductor layer 212, e.g., using a spun on resist process, a dry film process and/or an electrodeposited film process.

From form resist operation 106, flow moves to a pattern resist operation 108. In pattern resist operation 108, the resist is patterned to form a patterned resist layer 314 as illustrated in FIG. 3. The resist is patterned using any one of a number of techniques well known to those of skill in the art, e.g., using photolithography, and the particular technique used is not essential to this embodiment.

Patterned resist layer 314 includes a resist layer opening 316 that exposes a portion of conductor layer 212. More particularly, resist layer opening 316 is formed above, i.e., overlies, bond pad 206. Resist layer opening 316 is larger than bond pad 206 such that the area of conductor layer 212 exposed through resist layer opening 316 is larger than the area of bond pad 206. Generally, the portion of conductor layer 212 that directly overlies and surrounds bond pad 206 is exposed through resist layer opening 316.

Patterned resist layer 314 further includes a principal, e.g., first, surface 314P and a lower, e.g., second, surface 314L on conductor layer 212. Resist layer opening 316 is defined by a sidewall 318 of patterned resist layer 314. Sidewall 318 extends between lower surface 314L and principal surface 314P of patterned resist layer 314.

The processing used to form patterned resist layer 314 is tailored to achieve a sloped, vertical or retrograde profile in one embodiment. More particularly, in various embodiments, sidewall 318 is formed at various angles relative to a plane perpendicular to principal surface 204P of substrate 204.

In one embodiment, as indicated by the solid line, sidewall 318 has an angle greater than 0 degrees such that the area of resist layer opening 316 in a plane parallel to principal surface 204P of substrate 204 is less at lower surface 314L of patterned resist layer 314 than at principal surface 314P of patterned resist layer 314. In accordance with this embodiment, sidewall 318 is sometimes called a sloped sidewall and patterned resist layer 314 is sometimes said to have a sloped profile.

In another embodiment, as indicated by the dash-dot line, sidewall 318 has a zero degree angle such that the area of resist layer opening 316 in a plane parallel to principal surface 204P of substrate 204 is equal at lower surface 314L and principal surface 314P of patterned resist layer 314. In accordance with this embodiment, sidewall 318 is sometimes called a zero degree slope (vertical) sidewall and patterned resist layer 314 is sometimes said to have a vertical profile.

In yet another embodiment, as indicated by the dotted line, sidewall 318 has an angle less than 0 degrees such that the area of resist layer opening 316 in a plane parallel to principal surface 204P of substrate 204 is greater at lower surface 314L of patterned resist layer 314 than at principal surface 314P of patterned resist layer 314. In accordance with this embodiment, sidewall 318 is sometimes called a retrograde or reentrant sidewall and patterned resist layer 314 is sometimes said to have a retrograde or reentrant profile.

FIG. 4 is a cross-sectional view of lead free alloy bump structure 200 of FIG. 3 at a further stage during fabrication in accordance with one embodiment of the present invention. Referring now to FIGS. 1 and 4 together, from pattern resist operation 108, flow moves to a form secondary barrier layer operation 110. In form secondary barrier layer operation 110, a secondary barrier layer 420 is formed in resist layer opening 316 and on conductor layer 212. Illustratively, secondary barrier layer 420 is plated in resist layer opening 316 using an electroplating process or an electroless plating process.

Secondary barrier layer 420 provides a barrier protecting conductor layer 212 from additional layers, e.g., solder, formed on secondary barrier layer 420 as set forth below. In one embodiment, secondary barrier layer 420 is formed of nickel (Ni).

In one embodiment, form secondary barrier layer operation 110 is not performed and thus is an optional operation. Illustratively, conductor layer 212, e.g., copper, is formed with a thickness sufficient to provide protection against diffusion of additional layers formed thereon, e.g., tin diffusion.

From form secondary barrier layer operation 110, flow moves to a form solder operation 112. In form solder operation 112, a solder layer is formed on secondary barrier layer 420 as set forth below.

Figure 5:
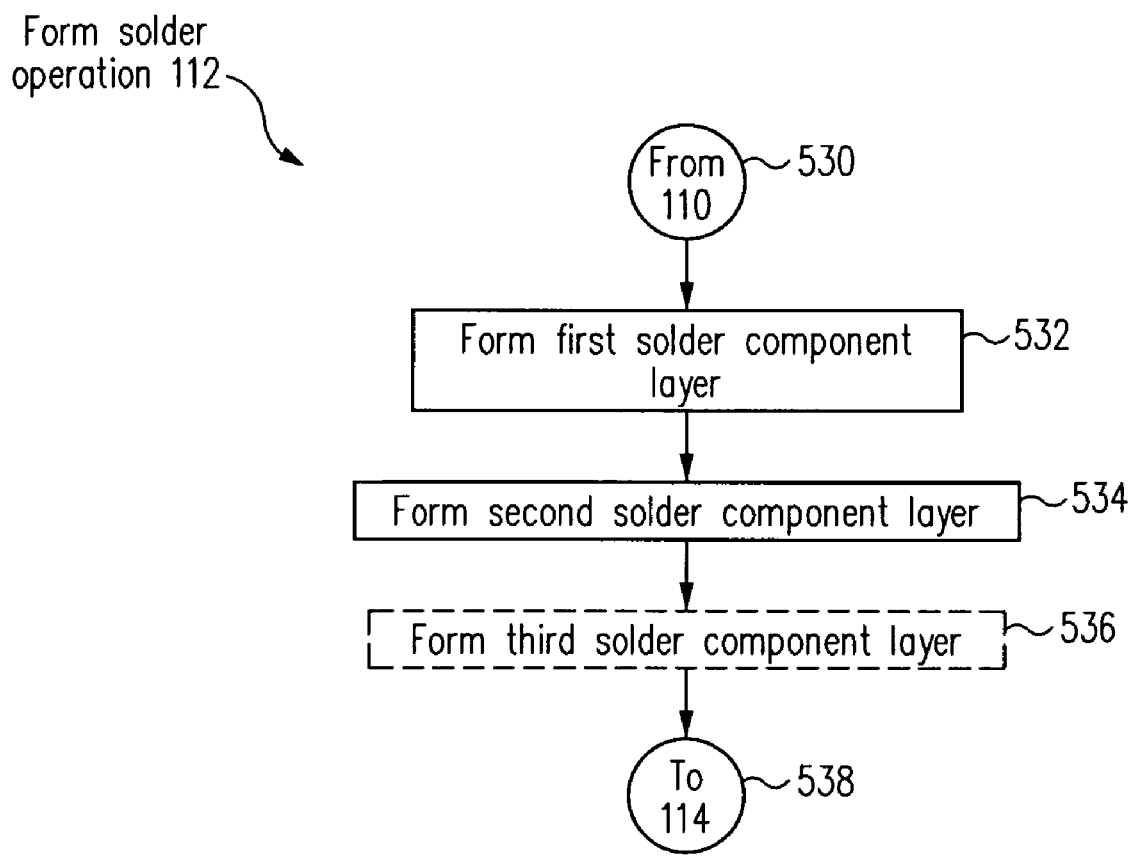
FIG. 5 is a form solder operation of the lead free alloy bump formation method of FIG. 1 in accordance with one embodiment of the present invention.

FIG. 5 is form solder operation 112 of lead free alloy bump formation method 100 of FIG. 1 in accordance with one embodiment of the present invention. FIG. 6 is a cross-sectional view of lead free alloy bump structure 200 of FIG. 4 at a further stage during fabrication in accordance with one embodiment.

Referring now to FIGS. 1, 5 and 6 together, from form secondary barrier layer operation 110, flow moves through a connector operation 530 to a form first solder component layer operation 532. In form first solder component layer operation 532, a first solder component layer 622 is formed, e.g., by plating, on secondary barrier layer 420 and within resist layer opening 316. In one particular embodiment, first solder component layer 622 is formed by electroplating using conductor layer 212 as the counter electrode. In one embodiment, first solder component layer 622 is tin (Sn).

In accordance with this embodiment, first solder component layer 622 completely fills resist layer opening 316 (FIG. 4) such that an upper, e.g., first, surface 622U of first solder component layer 622 is substantially coplanar with principal surface 314P of patterned resist layer 314. However, in another embodiment, first solder component layer 622 partially fills resist layer opening 316 (FIG. 4) such that upper surface 622U of first solder component layer 622 is recessed below principal surface 314P of patterned resist layer 314. In yet another embodiment, first solder component layer 622 over fills resist layer opening 316 (FIG. 4) such that upper surface 622U of first solder component layer 622 is above principal surface 314P of patterned resist layer 314.

From form first solder component layer operation 532, flow moves to a form second solder component layer operation 534. In form second solder component layer operation 534, a second solder component layer 624 is formed on first solder component layer 622. In accordance with the embodiment illustrated in FIG. 6, second solder component layer 624 is blanket formed on upper surface 622U of first solder component layer 622 and on principal surface 314P of patterned photoresist layer 314. Second solder component layer 622 is formed by evaporation, sputtering, electroplating, or electroless deposition.

In one embodiment, second solder component layer 624 is silver (Ag). In accordance with this embodiment, first solder component layer 622 (tin) alloys with second solder component layer 624 (silver) during reflow as discussed further below creating a binary tin-silver alloy solder, sometimes called a binary metal alloy solder.

In another embodiment, second solder component layer 624 is copper. In accordance with this embodiment, first solder component layer 622 (tin) alloys with second solder component layer 624 (copper) during reflow as discussed further below creating a binary tin-copper alloy solder, sometimes called a binary metal alloy solder.

The binary metal alloy solder is created by forming first solder component layer 622 and second solder component layer 624 separately using a simple single component formation method as discussed above. Accordingly, the cost of forming the binary metal alloy solder is low and the associated yield is high. Further, the use of lead is avoided.

Figure 7:
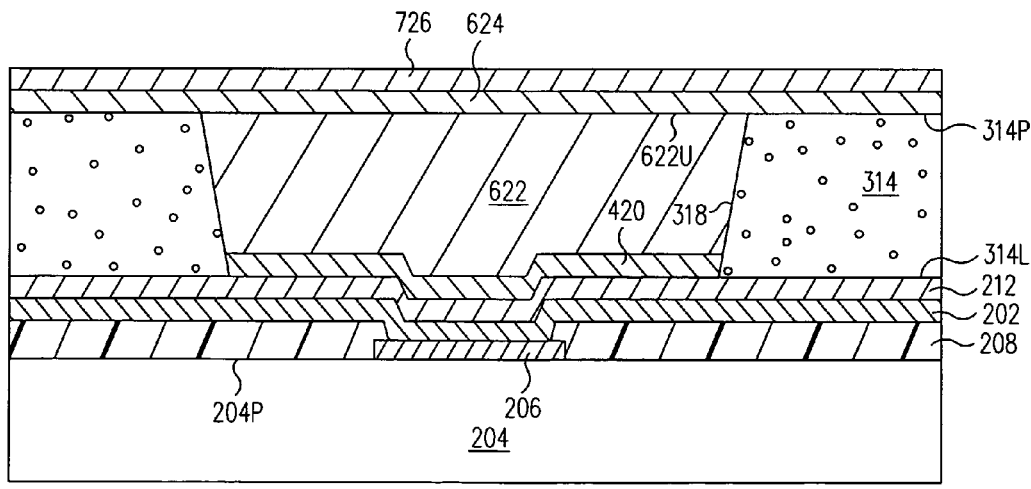
FIG. 7 is a cross-sectional view of the lead free alloy bump structure of FIG. 4 at a further stage during fabrication in accordance with one embodiment.

FIG. 7 is a cross-sectional view of lead free alloy bump structure 200 of FIG. 4 at a further stage during fabrication in accordance with one embodiment.

Referring now to FIGS. 1, 5 and 7 together, first solder component layer 622 and second solder component layer 624 are formed in form first solder component layer operation 532 and form second solder component layer operation 534, respectively, as discussed above and so are not repeated here. In accordance with this embodiment, second solder component layer 624 is silver.

From form second solder component layer operation 534, flow moves, optionally, to a form third solder component layer operation 536. In form third solder component layer operation 536, a third solder component layer 726 is formed on second solder component layer 624. In accordance with the embodiment illustrated in FIG. 7, third solder component layer 726 is blanket formed on second solder component layer 624. Third solder component layer 726 is formed by evaporation, sputtering, electroplating, or electroless deposition.

In one embodiment, third solder component layer 726 is copper. In accordance with this embodiment, first solder component layer 622 (tin) alloys with second solder component layer 624 (silver) and third solder component layer 726 (copper) during reflow as discussed further below creating a ternary tin-silver-copper alloy solder, sometimes called a ternary metal alloy solder.

Form third solder component layer operation 536 is optional and in one embodiment is not performed, e.g., in the embodiment of FIG. 6. From form third solder component layer operation 536 (or from form second solder component layer operation 534 in the event that form third solder component layer operation 536 is not performed), flow moves to a remove resist operation 114 through a connector operation 538.

Figure 8:
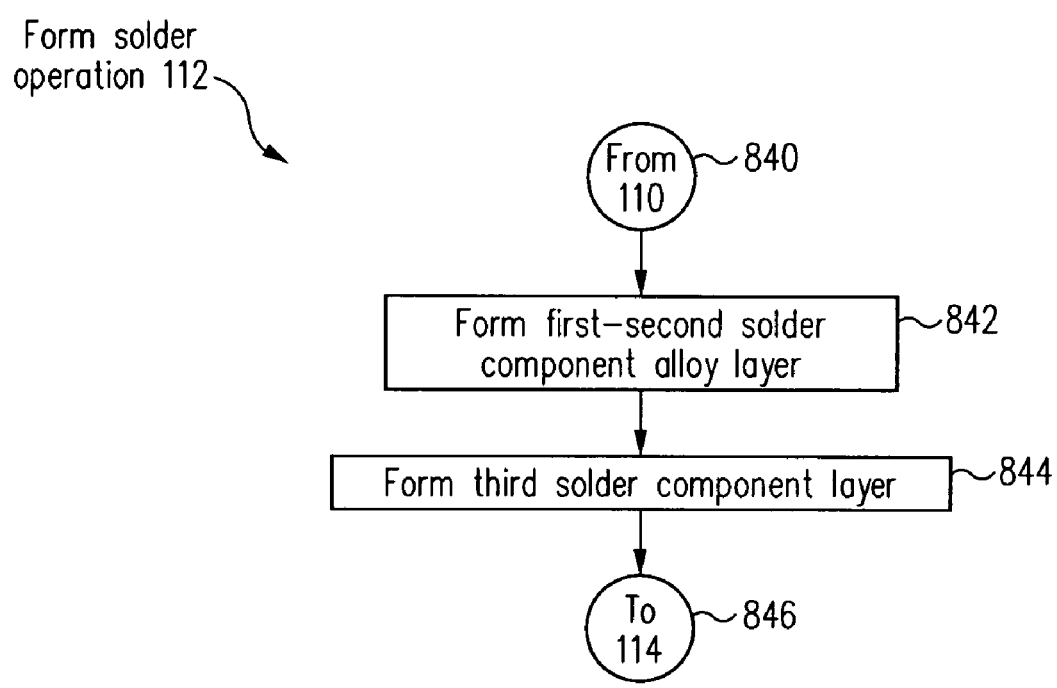
FIG. 8 is the form solder operation of the lead free alloy bump formation method of FIG. 1 in accordance with another embodiment of the present invention.
Figure 9:
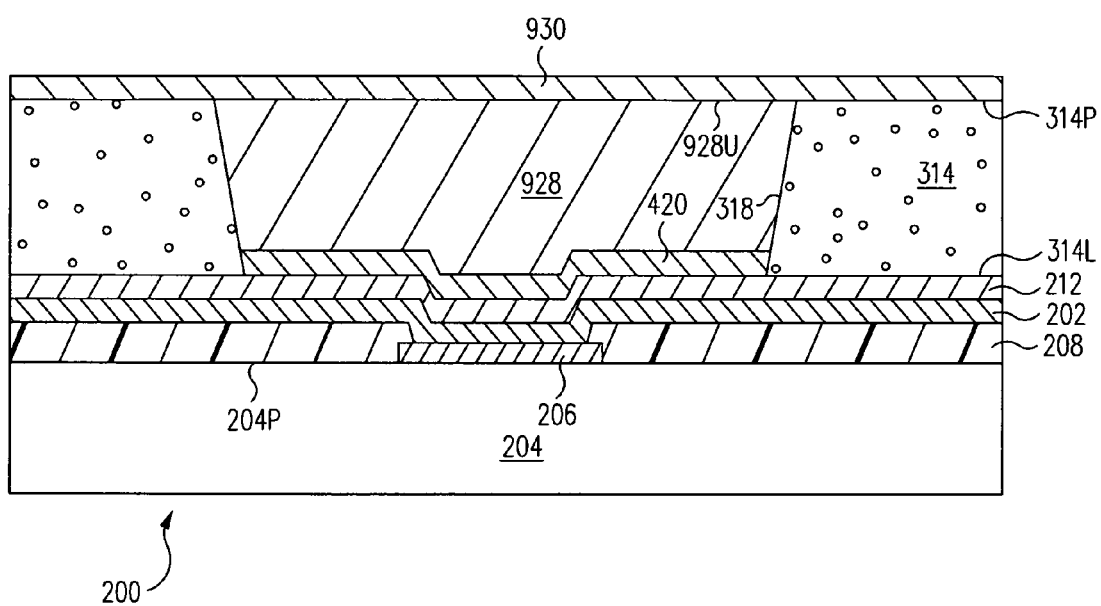
FIG. 9 is a cross-sectional view of the lead free alloy bump structure of FIG. 4 at a further stage during fabrication in accordance with another embodiment.

FIG. 8 is form solder operation 112 of lead free alloy bump formation method 100 of FIG. 1 in accordance with another embodiment of the present invention. FIG. 9 is a cross-sectional view of lead free alloy bump structure 200 of FIG. 4 at a further stage during fabrication in accordance with another embodiment.

Referring now to FIGS. 1, 8 and 9 together, from form secondary barrier layer operation 110, flow moves through a connector operation 840 to a form first-second solder component alloy layer operation 842. In form first-second solder component alloy layer operation 842, a first-second solder component alloy layer 928 is formed, e.g., by plating, on secondary barrier layer 420 and within resist layer opening 316. In one particular embodiment, first-second solder component alloy layer 928 is formed by electroplating using conductor layer 212 as the counter electrode.

In one embodiment, first-second solder component alloy layer 928 is an alloy of a first solder component and a second solder component. Illustratively, first-second solder component alloy layer 928 is a tin-silver alloy or a tin-copper alloy.

In accordance with this embodiment, first-second solder component alloy layer 928 completely fills resist layer opening 316 (FIG. 4) such that an upper, e.g., first, surface 928U of first-second solder component alloy layer 928 is substantially coplanar with principal surface 314P of patterned resist layer 314. However, in another embodiment, first-second solder component alloy layer 928 partially fills resist layer opening 316 (FIG. 4) such that upper surface 928U of first-second solder component alloy layer 928 is recessed below principal surface 314P of patterned resist layer 314. In yet another embodiment, first-second solder component alloy layer 928 over fills resist layer opening 316 (FIG. 4) such that upper surface 928U of first-second solder component alloy layer 928 is above principal surface 314P of patterned resist layer 314.

From form first-second solder component alloy layer operation 842, flow moves to a form third solder component layer operation 844. In form third solder component layer operation 844, a third solder component layer 930 is formed on first-second solder component alloy layer 928. In accordance with the embodiment illustrated in FIG. 9, third solder component layer 930 is blanket formed on upper surface 928U of first-second solder component alloy layer 928 and on principal surface 314P of patterned photoresist layer 314. Third solder component layer 930 is formed by evaporation, sputtering, electroplating, or electroless deposition.

In the embodiment where first-second solder component alloy layer 928 is a tin-silver alloy, third solder component layer 930 is copper. In accordance with this embodiment, first-second solder component alloy layer 928 (tin-silver alloy) alloys with third solder component layer 930 (copper) during reflow as discussed further below creating a ternary tin-silver-copper alloy solder, sometimes called a ternary metal alloy solder.

In the embodiment where first-second solder component alloy layer 928 is a tin-copper alloy, third solder component layer 930 is silver. In accordance with this embodiment, first-second solder component alloy layer 928 (tin-copper alloy) alloys with third solder component layer 930 (silver) during reflow as discussed further below creating a ternary tin-silver-copper alloy solder, sometimes called a ternary metal alloy solder.

From form third solder component layer operation 844, flow moves to remove resist operation 114 through a connector operation 846.

Figure 10:
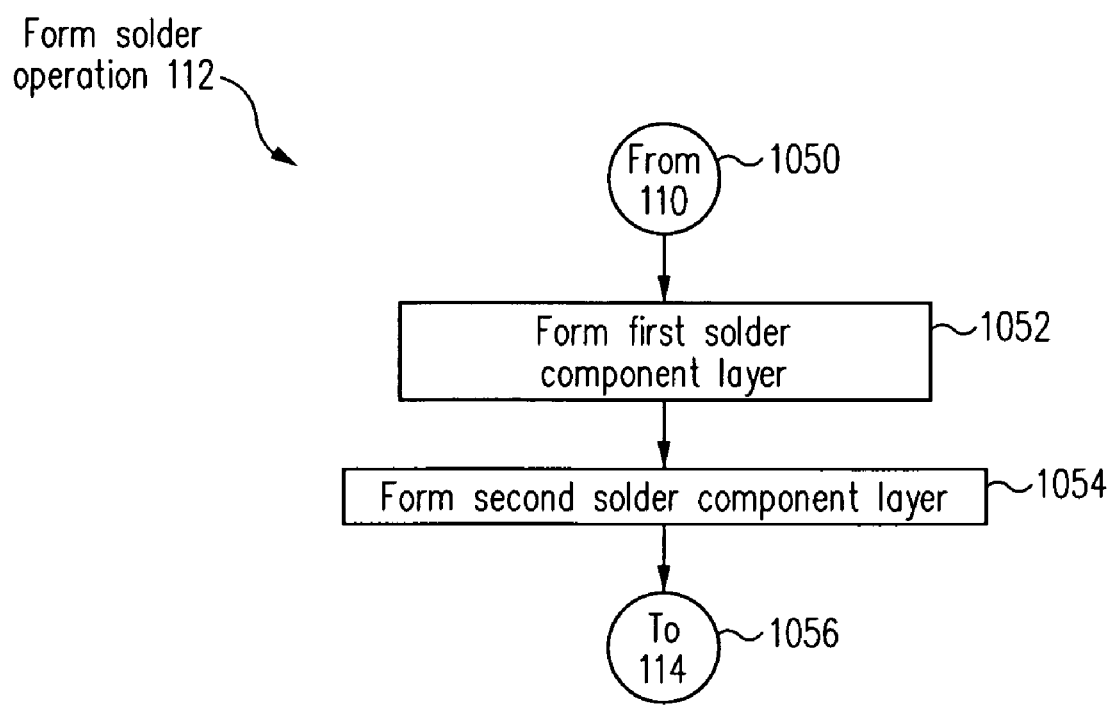
FIG. 10 is the form solder operation of the lead free alloy bump formation method of FIG. 1 in accordance with another embodiment of the present invention.
Figure 11:
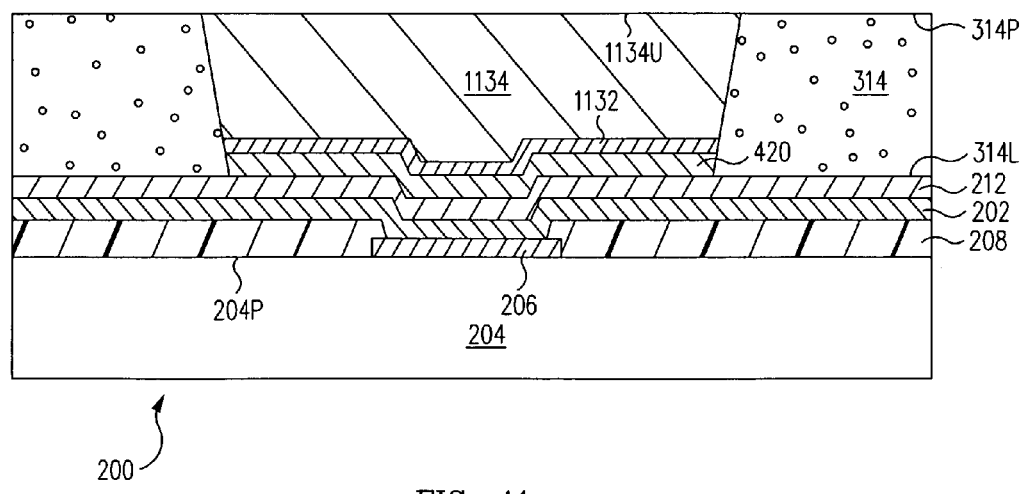
FIG. 11 is a cross-sectional view of the lead free alloy bump structure of FIG. 4 at a further stage during fabrication in accordance with another embodiment.

FIG. 10 is form solder operation 112 of lead free alloy bump formation method 100 of FIG. 1 in accordance with another embodiment of the present invention. FIG. 11 is a cross-sectional view of lead free alloy bump structure 200 of FIG. 4 at a further stage during fabrication in accordance with another embodiment.

Referring now to FIGS. 1, 10 and 11 together, from form secondary barrier layer operation 110, flow moves through a connector operation 1050 to a form first solder component layer operation 1052. In form first solder component layer operation 1052, a first solder component layer 1132 is formed on secondary barrier layer 420 and within resist layer opening 316. First solder component layer 1132 is formed by evaporation, sputtering, electroplating, or electroless deposition.

In various embodiments, first solder component layer 1132 is silver or copper. In accordance with this embodiment, first solder component layer 1132 only partially fills resist layer opening 316.

From form first solder component layer operation 1052, flow moves to a form second solder component layer operation 1054. In form second solder component layer operation 1054, a second solder component layer 1134 is formed, e.g., by plating, on first solder component layer 1132.

In accordance with this embodiment, second solder component layer 1134 completely fills resist layer opening 316 such that an upper, e.g., first, surface 1134U of second solder component layer 1134 is substantially coplanar with principal surface 314P of patterned resist layer 314. However, in another embodiment, second solder component layer 1134 partially fills resist layer opening 316 (FIG. 4) such that upper surface 1134U of second solder component layer 1134 is recessed below principal surface 314P of patterned resist layer 314. In yet another embodiment, second solder component layer 1134 over fills resist layer opening 316 (FIG. 4) such that upper surface 1134U of second solder component layer 1134 is above principal surface 314P of patterned resist layer 314.

Illustratively, second solder component layer 1134 is tin. As set forth above, in one embodiment, first solder component layer 1132 is silver. In accordance with this embodiment, first solder component layer 1132 (silver) alloys with second solder component layer 1134 (tin) during reflow as discussed further below creating a binary tin-silver alloy solder, sometimes called a binary metal alloy solder.

As also set forth above, in another embodiment, first solder component layer 1132 is copper. In accordance with this embodiment, first solder component layer 1132 (copper) alloys with second solder component layer 1134 (tin) during reflow as discussed further below creating a binary tin-copper alloy solder, sometimes called a binary metal alloy solder.

From form second solder component layer operation 1054, flow moves to remove resist operation 114 through a connector operation 1056.

Figure 12:
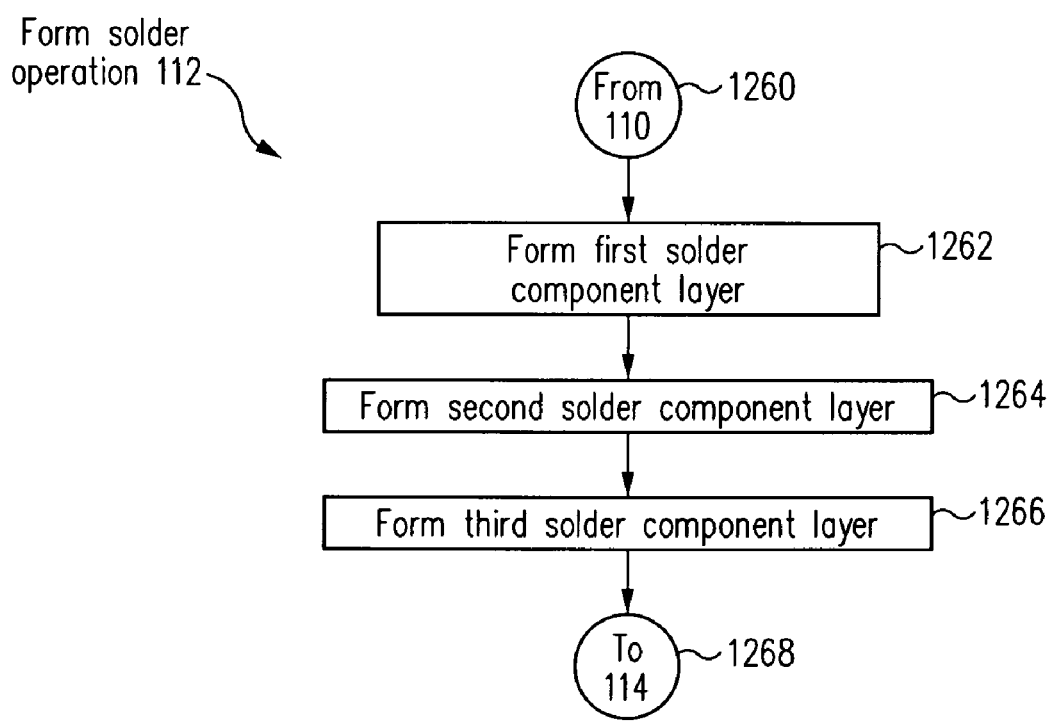
FIG. 12 is the form solder operation of the lead free alloy bump formation method of FIG. 1 in accordance with yet another embodiment of the present invention.
Figure 13:
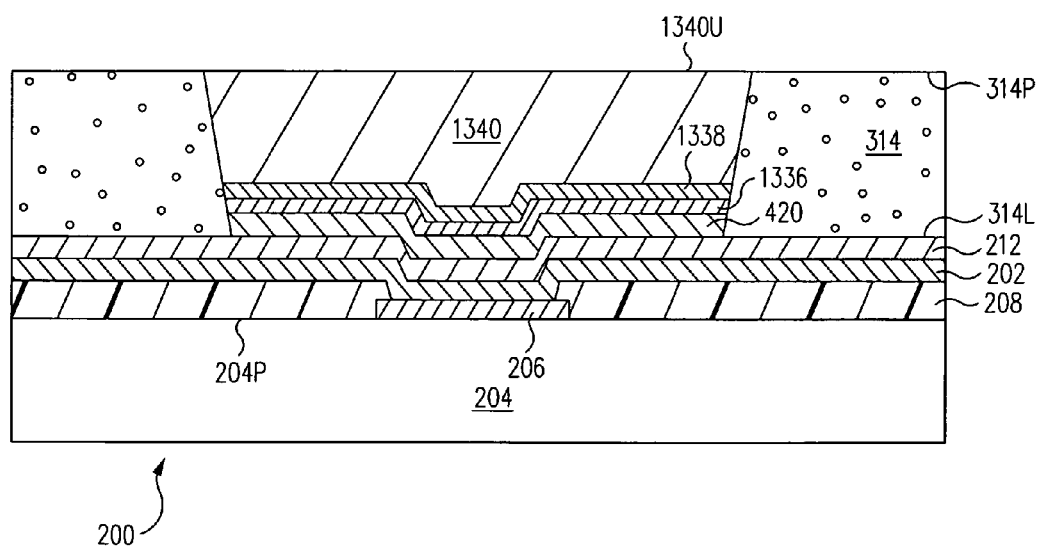
FIG. 13 is a cross-sectional view of the lead free alloy bump structure of FIG. 4 at a further stage during fabrication in accordance with another embodiment.

FIG. 12 is form solder operation 112 of lead free alloy bump formation method 100 of FIG. 1 in accordance with yet another embodiment of the present invention. FIG. 13 is a cross-sectional view of lead free alloy bump structure 200 of FIG. 4 at a further stage during fabrication in accordance with another embodiment.

Referring now to FIGS. 1, 12 and 13 together, from form secondary barrier layer operation 110, flow moves through a connector operation 1260 to a form first solder component layer operation 1262. In form first solder component layer operation 1262, a first solder component layer 1336 is formed on secondary barrier layer 420 and within resist layer opening 316 (FIG. 4). First solder component layer 1336 is formed by evaporation, sputtering, electroplating, or electroless deposition.

In one embodiment, first solder component layer 1336 is silver. Further, first solder component layer 1336 only partially fills resist layer opening 316.

From form first solder component layer operation 1262, flow moves to a form second solder component layer operation 1264. In form second solder component layer operation 1264, a second solder component layer 1338 is formed on first solder component layer 1336 and within resist layer opening 316. Second solder component layer 1338 is formed by evaporation, sputtering, electroplating, or electroless deposition.

In one embodiment, second solder component layer 1338 is copper. Further, second solder component layer 1338 only partially fills resist layer opening 316.

From form second solder component layer operation 1264, flow moves to a form third solder component layer operation 1266. In form third solder component layer operation 1266, a third solder component layer 1340 is formed, e.g., by plating, on second solder component layer 1338.

In accordance with this embodiment, third solder component layer 1340 completely fills resist layer opening 316 such that an upper, e.g., first, surface 1340U of third solder component layer 1340 is substantially coplanar with principal surface 314P of patterned resist layer 314. However, in another embodiment, third solder component layer 1340 partially fills resist layer opening 316 (FIG. 4) such that upper surface 1340U of third solder component layer 1340 is recessed below principal surface 314P of patterned resist layer 314. In yet another embodiment, third solder component layer 1340 over fills resist layer opening 316 (FIG. 4)

such that upper surface 1340U of third solder component layer 1340 is above principal surface 314P of patterned resist layer 314.

Illustratively, third solder component layer 1340 is tin. As set forth above, in one embodiment, first solder component layer 1336 is silver and second solder component layer 1338 is copper. In accordance with this embodiment, first solder component layer 1336 (silver) and second solder component layer 1338 (copper) alloy with third solder component layer 1340 (tin) during reflow as discussed further below creating a ternary tin-silver-copper alloy solder, sometimes called a ternary metal alloy solder.

From form third solder component layer operation 1266, flow moves to remove resist operation 114 through a connector operation 1268.

FIG. 14 is a cross-sectional view of lead free alloy bump structure 200 of FIG. 6 at a further stage during fabrication in accordance with one embodiment. Although operations 114, 116, 118, and 120 are discussed below in reference to the embodiment illustrated in FIG. 6 for simplicity of discussion, in light of this disclosure, those of skill in the art will understand that the discussion is equally applicable to the embodiments illustrated in FIGS. 7, 9, 11, and 13.

Referring now to FIGS. 1, 6 and 14 together, in remove resist operation 114, patterned resist layer 314 is removed using any one of a number of resist stripping techniques well known to those of skill in the art. Any portions of layers formed on patterned resist layer 314 are also removed along with patterned resist layer 314. To illustrate, the portion of second solder component layer 624 formed on patterned resist layer 314 is removed such that second solder component layer 624, sometimes called a patterned second solder component layer, remains only on first solder component layer 622 as illustrated in FIG. 14.

FIG. 15 is a cross-sectional view of lead free alloy bump structure 200 of FIG. 14 at a further stage during fabrication in accordance with one embodiment. Referring now to FIGS. 1, 14 and 15 together, from remove resist operation 114, flow moves to a reflow solder operation 116. In reflow solder operation 116, lead free alloy bump structure 200 is heated to reflow (melt and then cool) first solder component layer 622 and second solder component layer 624 (FIG. 14) to form a metal alloy solder bump 1542 as illustrated in FIG. 15. Metal alloy solder bump 1542, sometimes called a solder bump or ball, is electrically connected to bond pad 206 through secondary barrier layer 420, conductor layer 212 and primary barrier/adhesion layer 202. Metal alloy solder bump 1542 provides a means to form a reliable electrical and physical connection to bond pad 206. In one embodiment, metal alloy solder bump 1542 is reflowed to form an electrical connection between bond pad 206 and a terminal of a substrate.

From reflow solder operation 116, flow moves to a selectively remove conductor layer using secondary barrier layer as a mask operation 118. In selectively remove conductor layer using secondary barrier layer as a mask operation 118, conductor layer 212 is selectively removed using secondary barrier layer 420 as an etch mask.

More particularly, the exposed portions of conductor layer 212, i.e., the portions not covered by secondary barrier layer 420, are etched (removed) using a selective etch process that etches conductor layer 212 and not secondary barrier layer 420. Illustratively, a copper etch process that etches copper (conductor layer 212) but not nickel (secondary barrier layer 420) is used.

From selectively remove conductor layer using secondary barrier layer as a mask operation 118, flow moves to a selectively remove primary barrier/adhesion layer using secondary barrier layer and/or conductor layer as a mask operation 120. In selectively remove primary barrier/adhesion layer using secondary barrier layer and/or conductor layer as a mask operation 120, primary barrier/adhesion layer 202 is selectively removed using secondary barrier layer 420 and/or conductor layer 212 as an etch mask.

More particularly, the exposed portions of primary barrier/adhesion layer 202, i.e., the portions not covered by secondary barrier layer 420 and conductor layer 212, are etched (removed) using a selective etch process that etches primary barrier/adhesion layer 202 and not secondary barrier layer 420 and/or conductor layer 212. Illustratively, a titanium, titanium tungsten, titanium nitride, and/or chromium etch process that etches titanium, titanium tungsten, titanium nitride, and/or chromium (primary barrier/adhesion layer 202) but not nickel (secondary barrier layer 420) and/or copper (conductor layer 212) is used.

Although reflow solder operation 116 is set forth in FIG. 1 as preceding selectively remove conductor layer using secondary barrier layer as a mask operation 118 and selectively remove primary barrier/adhesion layer using secondary barrier layer and/or conductor layer as a mask operation 120, the order of operations is not limiting. In another embodiment, operation 118 is performed prior to operation 116. In yet another embodiment, operation 118 and operation 120, either as separate operations or simultaneous operations, are performed prior to operation 116. Still further, operation 116 (reflow solder) is performed twice, once without flux and once with flux and cleaning.

To illustrate, in one embodiment, a reflow before etch process includes: (1) operation 116 without flux; (2) operation 118; (3) operation 120; and (4) operation 116 with flux and cleaning. In another embodiment, an etch before reflow process includes: (1) operation 118; (2) operation 120; and (3) operation 116 with flux and cleaning.

As set forth above, one or more solder component layers are formed separately using simple formation methods. The solder component layers are reflowed to form the binary and/or ternary metal alloy solder. Accordingly, the cost of forming the binary and/or ternary metal alloy solder is low and the associated yield is high. Further, the use of lead is avoided.

Relative terms, such as beneath, upper, lower, top, and/or bottom may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first, second and similar terms are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present embodiments.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method comprising:
   forming a patterned resist layer on a substrate comprising a bond pad, the patterned resist layer comprising a resist layer opening overlying the bond pad;
   completely filling the resist layer opening with a first solder component layer, the first solder component layer comprising a first planar surface substantially coplanar with a principal surface of the patterned resist layer;
   forming a second solder component layer on the first planar surface of the first solder component layer that is substantially coplanar with the principal surface of the patterned resist layer and on the entire principal surface of the patterned resist layer;
   removing the patterned resist layer and any portion of the second solder component layer on the principal surface of the patterned resist layer; and
   reflowing the first solder component layer and the second solder component layer to form a binary metal alloy solder bump electrically connected to the bond pad.

2. The method of claim 1 wherein the first solder component layer is formed by plating.

3. The method of claim 2 wherein the first solder component layer is formed by electroplating.

4. The method of claim 1 wherein the second solder component layer is formed using a deposition selected from the group consisting of evaporation, sputtering, electroplating, or electroless.

5. The method of claim 1 wherein the first solder component layer comprises tin.

6. The method of claim 5 wherein the second solder component layer comprises silver.

7. The method of claim 6 wherein the binary metal alloy solder bump comprises a binary tin-silver alloy solder.

8. The method of claim 5 wherein the second solder component layer comprises copper, and wherein the binary metal alloy solder bump comprises a binary tin-copper alloy solder.

9. The method of claim 1 further comprising
   forming a primary barrier layer on the substrate;
   forming a conductor layer on the primary barrier layer;
   forming a secondary barrier layer in the resist layer opening and on the conductor layer; and
   selectively removing the conductor layer using the secondary barrier layer as a mask.

10. The method of claim 9 further comprising selectively removing the primary barrier layer using the secondary barrier layer as a mask.

11. The method of claim 1 wherein the patterned resist layer has a profile selected from the group consisting of sloped, vertical and retrograde.

* * * * *